United States Patent [19]

Hwang

[11] Patent Number: 6,124,218

[45] Date of Patent: Sep. 26, 2000

[54] METHOD FOR CLEANING WAFER SURFACE AND A METHOD FOR FORMING THIN OXIDE LAYERS

[75] Inventor: Chul Ju Hwang, Seongnam, Rep. of Korea

[73] Assignee: Jusung Engineering Co., Ltd., Kyunggi-do, Rep. of Korea

[21] Appl. No.: 08/916,424

[22] Filed: Aug. 22, 1997

[30] Foreign Application Priority Data

Mar. 19, 1997 [KR] Rep. of Korea ................. 97-9409

[51] Int. Cl.$^7$ ................................................. H01L 21/31
[52] U.S. Cl. ................................................. 438/788
[58] Field of Search ................................. 438/694, 725, 438/770, 795, 788, 792

[56] References Cited

U.S. PATENT DOCUMENTS

| | | | |
|---|---|---|---|
| 4,576,829 | 3/1986 | Kaganowicz et al. | 427/39 |
| 5,089,441 | 2/1992 | Moslehi | 437/225 |
| 5,122,482 | 6/1992 | Hayashi et al. | 437/225 |
| 5,354,698 | 10/1994 | Cathey, Jr. | 437/20 |
| 5,495,121 | 2/1996 | Yamazaki et al. | 257/384 |
| 5,811,358 | 9/1998 | Tseng et al. | 438/725 |
| 5,869,405 | 2/1999 | Gonzalez et al. | 438/770 |
| 5,910,019 | 6/1999 | Watanabe et al. | 438/488 |

OTHER PUBLICATIONS

Hofstra P G et al, "Etching of INP Surface Oxide with Atomic Hydrogen Produced By Electron Cyclotron Resonance", Journal of Vacuum Science and Technology, Part A, vol. 13, No. 4, Jul. 1, 1995.

Ramm J et al., "Low Temperature Epitaxial Growth By Molecular Beam Epitaxy on Hydrogen–Plasma–Cleaned Silicon Wafers", Thin Solid Films, vol. 246, No. 1/02, Jun. 15, 1994.

Barlow K J et al., "Ionic Species Responsible for the Plasma Anodization of Silicon", Applied Physics Letters, vol. 53, No. 1, Jul. 4, 1988.

Jung–II Lee et al., "Remote Plasma–Assisted Oxidation of INP", Journal of Materials Science Letters, vol. 10, No. 17, Sep. 1, 1991.

Rudder R. A. et al., "Remote Plasma–Enhanced Chemical-Vapor Deposition of Epitaxial Ge Films", Journal of Applied Physics, vol. 60, No. 10, Nov. 15, 1986.

"Dry Wafer Cleaning Processes" Handbook of Semiconductor Wafer Cleaning Technology.

Montgomery J. S., et al., "Correlation of Roughness and Device Properties for Hydrogen Plasma Cleaning of Si(100) Prior to Gate Oxidation", Materials Research Society, vol., 386, 1995.

*Primary Examiner*—David Nelms
*Assistant Examiner*—Renee' R. Berry
*Attorney, Agent, or Firm*—Bacon & Thomas

[57] ABSTRACT

A method for removing a native oxide and contaminants from a wafer surface at a relatively low temperature ranged from 100° C. to 800° C. uses $H_2$ gas or hydrogen containing gas comprising ion sources chosen from impurity ions such as boron, phosphorus, arsenic, antimony, aluminum, and germanium activated by a plasma to be applied to the wafer surface in a vacuum furnace. A method for forming a thin oxide on a silicon wafer or substrate at a relatively low temperature ranged from 250° C. to 800° C. applies $O_2$ or $NO_2$ by using a plasma to the silicon wafer in a vacuum furnace.

17 Claims, No Drawings

METHOD FOR CLEANING WAFER SURFACE AND A METHOD FOR FORMING THIN OXIDE LAYERS

BACKGROUND OF THE INVENTION

1. Field of the Invention

The present invention generally relates to a method for manufacturing semiconductor devices, and more particularly to a method for removing unnecessary oxide layers and particles from the wafer surface and to a method for forming high quality oxide layers on the wafer surface.

2. Description of the Related Arts

In semiconductor fabrication processes, a number of processing steps such as oxidation, etching, lithography, and film deposition are generally required for forming microcircuits on a semiconductor, e.g., a silicon wafer or substrate. During transfer of the wafer after each processing step, the wafer is under exposure to air, and thus the surface of the silicon wafer is covered at all times with a layer of $SiO_2$, which is gradually thickening with time to an upper limit of about 40 Å.

This monolayer of oxide, referred to as native oxide, needs to be eliminated before a subsequent step begins, because the native oxide is an insulating layer which is not designed.

On the other hand, the surface of the silicon wafer is contaminated by such as particles during the transfer. For removing the native oxide and the contaminants from the wafer surface, several techniques have been developed including a wet cleaning method, and a dry cleaning in which either anhydrous HF vapor or $H_2$ gas is used under high temperature and vacuum conditions. However, the existing cleaning techniques are not satisfactory for removing the native oxide and the contaminants without damaging the wafer surface.

Thin oxide layers such as interlayer dielectrics, gate insulators used in MOS (Metal Oxide Semiconductor) device, and dielectric layers employed in capacitors must represent good insulating property enough to play a role of insulating layers even with very small thickness.

Conventional technique for forming oxide films is carried out in a diffusion furnace in which the silicon wafer is maintained at low pressure and high temperature. The oxide is grown by supplying oxidants, e.g., an oxygen gas into the furnace in atmosphere or nitrogen environment. However, the oxide formed by the conventional technique does not have excellent electrical properties and has a limitation used as an insulating layer.

SUMMARY OF THE INVENTION

It is an object of the present invention to provide a method for effectively removing the native oxide and the contaminants from the wafer surface at a relatively low temperature.

It is another object of the present invention to provide a method for forming, at a relatively low temperature, insulating oxide layers having good electrical properties.

According to one aspect of the present invention, the native oxide and the contaminants are effectively removed from the silicon wafer surface by applying $H_2$ gas or hydrogen containing gas activated by a plasma to the wafer in a vacuum and relatively low temperature environment.

According to another aspect of the present invention, a thin and high-quality oxide is grown at a relatively low temperature by activating a plasma and applying $O_2$, $N_2O$, or $NO_2$ to the silicon wafer placed in a vacuum furnace.

DETAILED DESCRIPTION OF THE PRESENT INVENTION

In order to remove the oxide layer naturally formed on a silicon wafer and contaminants attached to the wafer surface, the present invention uses $H_2$ gas or a gas containing hydrogen such as $PH_3$, $B_2H_6$, $SbH_3$, and $AsH_3$. The $H_2$ gas and the hydrogen containing gas are activated by a plasma in a vacuum furnace at a relatively low temperature ranged from 100° C. to 800° C. The hydrogen containing gas may be chosen from ion sources used in impurity doping of silicon substrate, such as boron, phosphorus, arsenic, antimony, aluminum, germanium, and so on.

With the use of the hydrogen containing gas in the cleaning process, the target is doped with the ion sources and also is cleaned. When the target to be cleaned is polysilicon layers used as gate electrodes in MOS devices, the present invention can prevent lowering of impurity density near the surface of the gate electrode layer due to the fact that if the hydrogen containing gas ionized by the plasma is employed in the cleaning process, the polysilicon surface is cleaned and the impurity ion contained in the gas is doped into the inside of the polysilicon.

Thin oxide layers such as interlayer dielectrics, gate insulators, and dielectric layers employed in capacitors are required to be grown with high-quality at relatively low temperatures. According to the present invention, oxygen species such as $O_2$ or $NO_2$ are supplied into a vacuum furnace in which silicon wafers are placed. The oxygen species are activated by a plasma. The vacuum furnace is maintained to a relatively low temperature ranged from 250° C. to 800° C.

With the present invention, since the oxide is grown in a vacuum furnace, there is no native oxide on the wafer surface and oxide layer about 5 Å to 1 um with high-quality can be formed.

As explained so far, according to the present invention, it is possible to effectively remove native oxide layers and contaminants covered on the silicon wafer surface at a relatively low temperature and to form high-quality thin oxide layer at a relatively low temperature and vacuum condition.

While the present invention has been described with reference to illustrative embodiments, this description is not intended to be construed in a limiting sense. Various modifications and combinations of the illustrative embodiment of the present invention, will be apparent to persons skilled in the art upon reference to the description. It is therefore intended that the appended claims encompass any such modifications or embodiments.

What is claimed is:

1. A method for removing an unnecessary oxide layer and contaminant from a semiconductor wafer, said method comprising the steps of:

providing semiconductor device structures having impurity doped surfaces on a semiconductor substrate;

preparing a hydride gas containing the doping impurity as well as hydrogen;

forming plasmas of the hydride gas by applying plasma power to the hydride gas; and plasma-cleaning the impurity doped surfaces in a vacuum and relatively low temperature environment by the hydride gas plasma.

2. The method of claim 1, wherein the low temperature ranges from 100° C. to 800° C.

3. The method of claim 1, wherein said doping impurity is selected from the group consisting of boron, phosphorus, arsenic, antimony, germanium and aluminum.

4. The method of claim 1, wherein said hydride gas is selected from the group consisting of $B_2H_6$, $PH_3$, $AsH_3$, $SbH_3$ and $GeH_4$.

5. The method of claim 2, wherein said doping impurity is selected from the group consisting of boron, phosphorus, arsenic, antimony, germanium and aluminum, and wherein said hydride gas is selected from the group consisting of $B_2H_6$, $PH_3$, $AsH_3$, $SbH_3$ and $GeH_4$.

6. A method for removing an unnecessary native silicon oxide from a silicon wafer, said method comprising applying a hydrogen gas activated by a plasma to the semiconductor wafer in a vacuum and relatively low temperature environment.

7. A method as claimed in claim 6, wherein the low temperature ranges from 100° C. to 800° C.

8. A method as claimed in claim 6, wherein the hydrogen gas contains ion sources used in impurity doping of a silicon substrate.

9. A method as claimed in claim 8, wherein the ion sources are selected from the group consisting of boron, phosphorous, arsenic, antimony, germanium and aluminum.

10. A method for forming an silicon oxide on a silicon wafer, said method comprising applying an oxygen containing gas activated by a plasma to the semiconductor wafer in a vacuum and relatively low temperature environment.

11. A method as claimed in claim 10, wherein the low temperature ranges from 250° C. to 800° C.

12. The method as claimed in claim 10, wherein the oxygen containing gas comprises $O_2$.

13. The method as claimed in claim 10, wherein the oxygen containing gas comprises $NO_2$.

14. The method as claimed in claim 10, wherein the oxygen containing gas comprises $N_2O$.

15. The method as claimed in claim 10, wherein the oxide has a thickness of from 5 Å to 1 µm.

16. A method for forming a thin oxide layer on a semiconductor wafer, said method comprising the steps of:

plasma-cleaning a native oxide layer and contaminant from a surface of the semiconductor wafer by way of placing the semiconductor wafer in a vacuum and relatively low temperature environment, introducing a first gas containing hydrogen in the environment, forming a plasma of the first gas, and applying the first gas to the surface of the semiconductor wafer; and forming the thin oxide layer on the cleaned surface of the semiconductor wafer by way of introducing a second gas containing oxygen in the environment, forming a plasma of the second gas, and applying the second gas to the cleaned surface of the semiconductor wafer.

17. The method of claim 16, wherein the second gas is $O_2$, $N_2O$ or $NO_2$.

* * * * *